(12) United States Patent
Saraswat et al.

(10) Patent No.: US 9,287,196 B2
(45) Date of Patent: Mar. 15, 2016

(54) RESONANT CLOCKING FOR THREE-DIMENSIONAL STACKED DEVICES

(71) Applicant: Intel Corporation, Santa Clara, CA (US)

(72) Inventors: Ruchir Saraswat, Swindon (GB); Uwe Zillmann, Braunschweig (DE); Andre Schaefer, Braunschweig (DE); Tor Lund-Larsen, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 406 days.

(21) Appl. No.: 13/730,331

(22) Filed: Dec. 28, 2012

(65) Prior Publication Data

US 2014/0183691 A1 Jul. 3, 2014

(51) Int. Cl.
| | |
|---|---|
| *H01L 27/08* | (2006.01) |
| *H01L 23/48* | (2006.01) |
| *H01L 23/522* | (2006.01) |
| *H01L 25/065* | (2006.01) |
| *H01L 27/06* | (2006.01) |
| *H01L 23/64* | (2006.01) |

(52) U.S. Cl.
CPC .......... *H01L 23/481* (2013.01); *H01L 23/5223* (2013.01); *H01L 23/5227* (2013.01); *H01L 23/642* (2013.01); *H01L 23/645* (2013.01); *H01L 25/0657* (2013.01); *H01L 27/0688* (2013.01); *H01L 2223/6616* (2013.01); *H01L 2223/6666* (2013.01); *H01L 2223/6672* (2013.01); *H01L 2225/06527* (2013.01); *H01L 2225/06544* (2013.01); *H01L 2924/0002* (2013.01)

(58) Field of Classification Search
CPC .............. H01L 23/481; H01L 23/5223; H01L 23/5227; H01L 25/0657; H01L 27/0688
USPC ......................................................... 257/531
See application file for complete search history.

(56) References Cited

U.S. PATENT DOCUMENTS

| | | | | |
|---|---|---|---|---|
| 2005/0224989 | A1* | 10/2005 | Myers et al. | 257/774 |
| 2009/0140383 | A1* | 6/2009 | Chang et al. | 257/531 |
| 2010/0148225 | A1* | 6/2010 | Mouli | 257/272 |
| 2012/0049322 | A1* | 3/2012 | Su et al. | 257/532 |
| 2013/0049824 | A1* | 2/2013 | Kim et al. | 327/141 |
| 2013/0293292 | A1* | 11/2013 | Droege et al. | 327/565 |
| 2014/0071652 | A1* | 3/2014 | McShane et al. | 361/820 |
| 2014/0097890 | A1* | 4/2014 | Li et al. | 327/551 |

OTHER PUBLICATIONS

Alan J. Drake et al., "Resonant Clocking Using Distributed Parasitic Capacitance," IEEE Journal of Solid-State Circuits, vol. 39, No. 9, Sep. 2004, 9 pages.

P. Ramm et al., "Through Silicon Via Technology—Processes and Reliability for Wafer-Level 3D System Integration," 2008 Electronic Components and Technology Conference, IEEE, 6 pages.

Rozalia Beica et al, "Through Silicon Via Copper Electrodeposition for 3D Integration," 2008 Electronic Components and Technology Conference, IEEE, 7 pages.

* cited by examiner

*Primary Examiner* — Andy Huynh
*Assistant Examiner* — Sitaramarao S Yechuri
(74) *Attorney, Agent, or Firm* — Blakely, Sokoloff, Taylor & Zafman LLP

(57) ABSTRACT

Resonant clocking for three-dimensional stacked devices. An embodiment of an apparatus includes a stack including integrated circuit dies; and through silicon vias through at least one of the dies, wherein at least a first through silicon via of the through silicon vias includes a capacitive structure or an inductive structure, the first through silicon via being formed in a first die of the plurality of dies. The apparatus includes a resonant circuit, the first through silicon via used as a first circuit element of the resonant circuit.

14 Claims, 8 Drawing Sheets

RESONANT CLOCKING FOR THREE-DIMENSIONAL STACKED DEVICES

TECHNICAL FIELD

Embodiments of the invention generally relate to the field of electronic devices and, more particularly, resonant clocking for three-dimensional stacked devices.

BACKGROUND

In computer memory, resonant clocking may be utilized, where a conventional apparatus may utilize on-chip spiral inductors that resonate with the wiring capacitance of a clock network and capacitors coupled with the inductors, forming a resonant circuit that is tuned to (resonates at) a clock frequency. A resonant circuit may also be referred to as a resonator, an LC tank circuit (where "LC" indicates an inductor and a capacitor), a tuned circuit, or other similar term.

However, using an active metal layer of an integrated circuit (IC) chip for creating a resonant circuit structure reduces available routing space within the active material. In addition, additional capacitance is generally needed to bring the resonant frequency of the LC tank circuit to the frequency of interest for clocking, thus further reducing the available space for the memory chip. As a result, a chip may provide less capacity or capability, or there may be additional cost in design and producing a device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to resonant clocking for 3D stacked devices.

As used herein:

"3D stacked device" (where 3D indicates three-dimensional) or "stacked device" means an electronic device including multiple integrated circuit dies (or wafers), where the dies are coupled together in stack.

"3D stacked memory" or "stacked memory" means a computer memory including one or more coupled memory die layers, memory packages, or other memory elements. A stacked memory is an example of a stacked device. The memory may be vertically stacked or horizontally (such as side-by-side) stacked, or otherwise contain memory elements that are coupled together. In particular, a stacked memory dynamic random access memory (DRAM) device or system may include a memory device having a plurality of DRAM die layers. A stacked memory device may also include system elements in the device, which may be referred to herein as a system layer or element, where the system layer may include elements such as a CPU (central processing unit), a memory controller, and other related system elements. The system layer may include a system on chip (SoC). In some embodiments, the logic chip may be an application processor or graphics processing unit (GPU).

In a stacked device, multiple dies are stacked together. In an example of a stacked DRAM device, such as a memory device that is compatible with the Wide I/O standard (Wide I/O Single Data Rate, JEDEC Standard JESD229, December 2011), one or more DRAM dies in a memory stack may be stacked with a system element such as a system on chip (SoC) wafer in the same package. The stacked device may utilize through silicon via (TSV) manufacturing techniques, where vias are produced through silicon dies to provide signal and power paths through one or more dies of the stacked device.

For example, a stacked memory device may include a system chip and one or more DRAM chips, the DRAM chips forming memory strata or layers coupled with the system chip, where the strata or layers include signal and power paths provided by TSVs. Each memory stratum may include a plurality of tiles (or portions) of memory. The stacked memory device may include multiple channels, where a channel may include a column of tiles, such as a tile in each of the strata of the memory device. In some embodiments, a memory device may be a memory device that is compatible with the Wide I/O standard.

Figure 1:
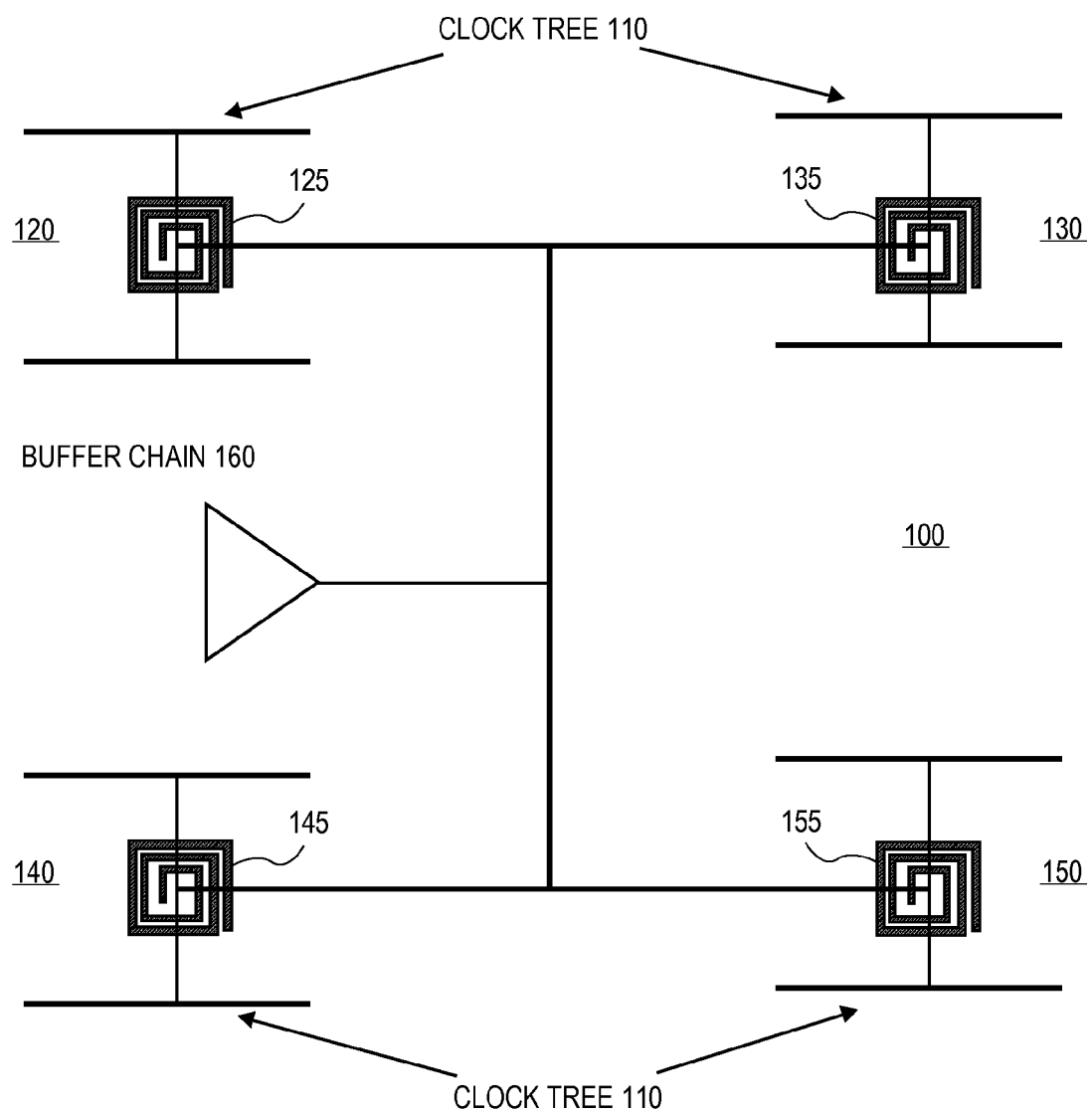
FIG. 1 is an illustration of a conventional resonant clock network.

In conventional devices, resonant clocking may be implemented by the addition of on-chip inductors. FIG. 1 is an illustration of a conventional resonant clock network. In this illustration, the clock network 100, which may be implemented conventionally in a two-dimensional circuit, includes four resonant circuits connected to a clock tree 110, illustrated as a first resonator circuit 120, a second resonator circuit 130, a third resonator circuit 140, and a fourth resonator circuit 150. Each resonant circuit includes an inductor on the active metal layer of the chip, illustrated as a first spiral inductor 125 in the first resonator circuit 120, a second spiral inductor 135 in the second resonator circuit 130, a third spiral inductor 145 in the third resonator circuit 140, and a fourth spiral inductor 155 in the fourth resonator circuit 150. The resonator circuits are each connected with a buffer chain 160.

However, the construction of circuits as illustrated in FIG. 1 will utilize valuable area in a stacked device if such a resonant clock network is implemented as a conventional resonant circuit.

In some embodiments, stacked device, including, but not limited to, a stacked memory device, includes resonant clocking, where TSVs are utilized in the formation of resonant circuits, the TSVs providing capacitance, inductance, or both for such resonant circuits. In some embodiments, TSVs are formed to provide coaxial capacitors, inductors, or both. Further, TSVs provide a path to the RDL (re-distribution layer) on the back side of die layers, thus in some embodiments creating an LC tank circuit while saving space on the active side of the die layers. In some embodiments, an LC tank circuit may be shared among the clock grids of multiple adjacent die layers, where the clock grids are synchronous with each other.

In some embodiments, a computer chip includes a silicon die and one or more through silicon vias through the silicon die, wherein the one or more silicon vias include a first silicon via, the first silicon via having a capacitive structure to provide a capacitance or an inductive structure to provide an inductance.

In some embodiments, an alternative implementation of an LC tank circuit would be as an oscillator to generate a clock on a die with a phase locked array, or for generating natural oscillations whenever required on a die.

Figure 2:
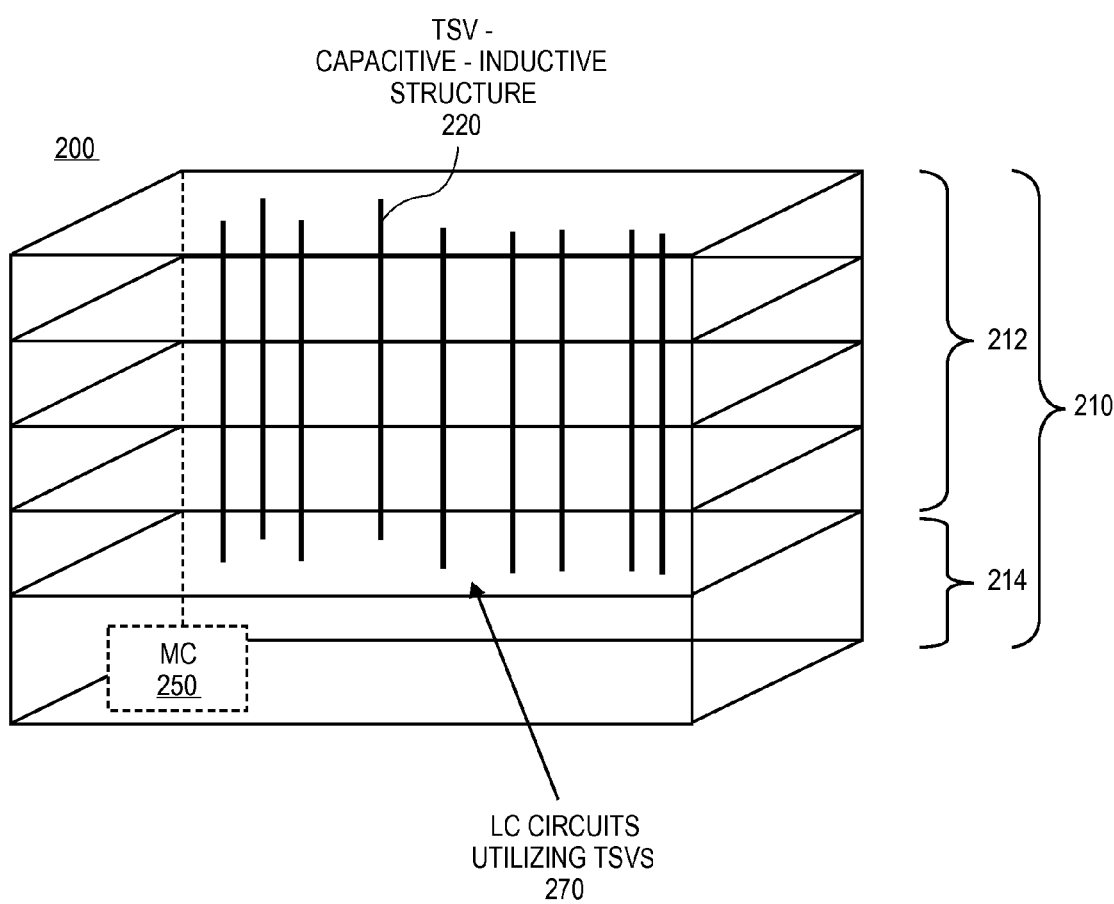
FIG. 2 is an illustration of an embodiment of a three-dimensional stacked device with resonant clocking.

FIG. 2 is an illustration of an embodiment of a 3D stacked device with resonant clocking. In some embodiments, a 3D stacked device 200 includes multiple integrated circuit dies 210, where such layers a coupled together. For this illustration, five die layers are illustrated, but the stacked device 200 may include any two or more dies in any order. In one example, a 3D stacked memory device, such as a WideIO memory device, includes a system layer or other element, such as the lower die layer 214. The system element is coupled with one or more DRAM memory die layers, also referred to herein as the memory stack, which may be illustrated as the upper die layers 212. In some embodiments, the system element may be an SoC or other similar element. In this illustration, the DRAM memory die layers appear as four memory die layers. However, embodiments are not limited to any particular number of memory die layers in a memory stack. In the example of a stacked memory device, the system element 214 may include a memory controller 250, such as a WideIO memory controller, for the memory stack 212.

In some embodiments, one or more die layers include a plurality of TSVs to provide signal and power paths through the die layers. While a small number or TSVs are provided in FIG. 1 for ease of illustration, an actual number of TSVs would be much greater. In some embodiments, one or more TSVs 220 includes a capacitive or inductive structure, whereby a TSV may act as capacitor or inductor in an LC tank circuit.

In some embodiments, the TSVs are used in the formation of LC tank circuits 270 for resonant clocking of the device, where a TSV with a capacitive structure may be connected with as inductor, such as inductor formed on the RDL layer of a DRAM layer, or a TSV with an inductive structure may be connected with a capacitor. In some embodiments, an LC tank circuit may include both a first TSV with a capacitive structure and a second TSV with an inductive structure. The resonant frequency of an LC tank circuit would be:

$$f = \frac{1}{2\pi}\omega = \frac{1}{2\pi\sqrt{LC}}$$

Where:
L=inductance
C=Capacitance
ω=Angular Frequency

Figure 3:
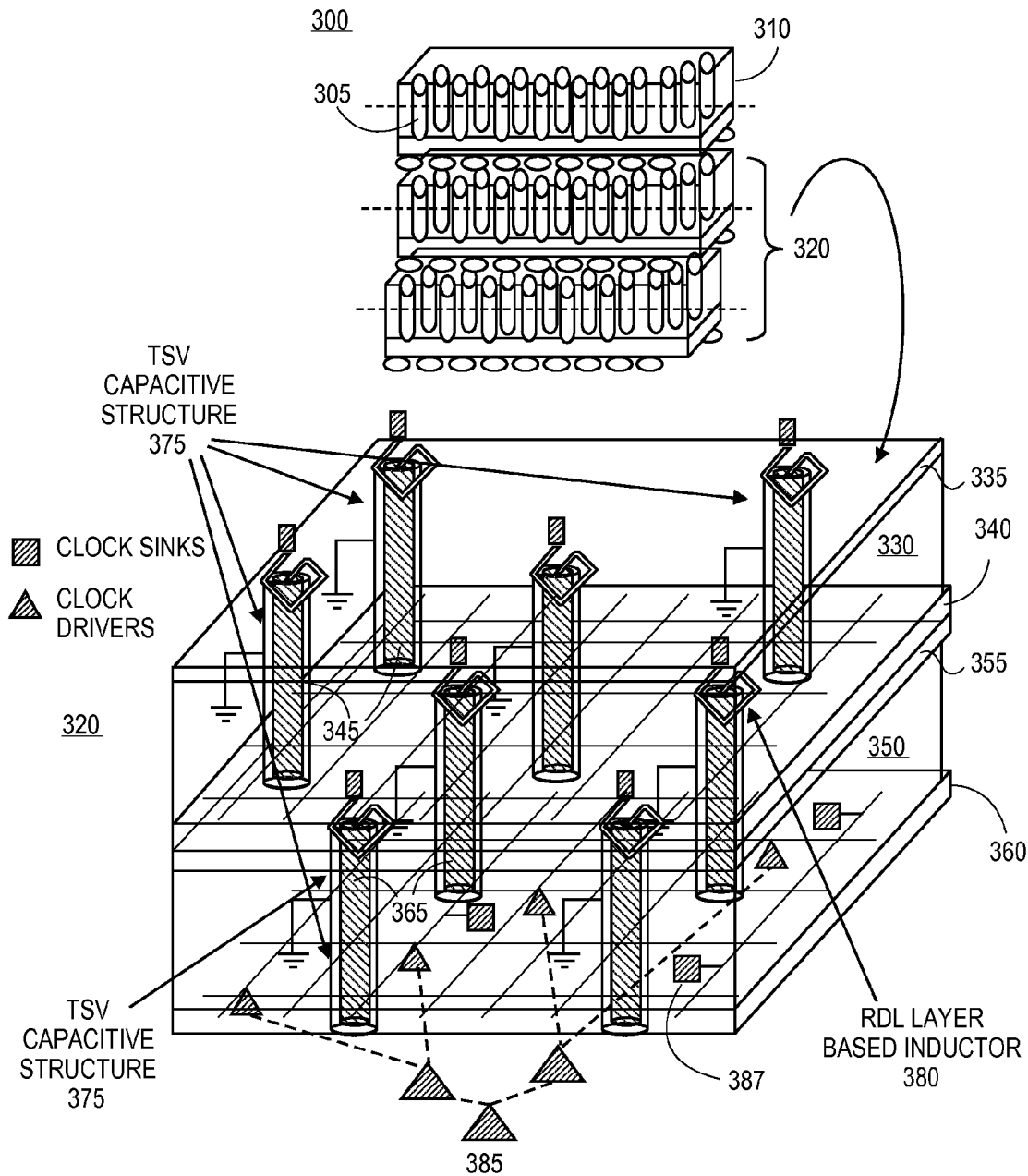
FIG. 3 is an illustration of an embodiment of a stacked device including a resonant clock network.

FIG. 3 is an illustration of an embodiment of a stacked device including a resonant clock network. In some embodiments, a stacked device 300 includes multiple TSVs 305 connecting the multiple die layers 310, where such TSVs provide capacitance and connection to inductors formed on the RDL side opposite the active metal side (the back side) of one or more die layers.

In this illustration, a portion 320 of the stacked device may include two stacked die layers, a first (upper) layer 330 with an active metal side 340 and an opposite RDL 335 and a second (lower) layer 350 with an active metal side 360 and an opposite RDL 355. The first layer 330 includes a first set of TSVs 345 formed through the first layer, and the second layer 350 includes a second set of TSVs 365 formed through the second layer. Clock drivers 385 drive clock signals on the stacked die layers, where the clock signals are carried by one or more TSVs through each die layer to the next die in the stack. Also illustrated are clock sinks 387, where a clock sink is a device or circuit utilizing a clock signal. Other TSVs may be utilized for other purposes, including the transport of other signals between die layers and conducting power to each die layer.

In some embodiments, the one or more TSVs include capacitive structures 375 to generate capacitance for resonant circuits, the TSVs being formed with a first cylindrical conductor surrounded by a dielectric material layer, which in turn is surrounded by a second hollow cylinder (tube) conductor, the first and second conductor forming plates of a coaxial capacitor structure. In some embodiments, one or more TSVs including a first conductor and a second conductor, the first and second conductors being coaxial. The one or more TSVs are further connected to inductances 380, such as the illustrated spiral inductances, formed on the RDL 335 and 355 of each die layer, the inductors 380 and the capacitive structures 375 forming LC tank circuits. In some embodiments, the one or more TSVs are utilized both for the transport of clock signals between die layers and for the generation of capacitance for the LC tank circuits.

In some embodiments, an LC tank circuit utilizing a TSV may be shared among multiple die layers. In some embodiments, an LC tank circuit implemented utilizing a TSV in a first die, the TSV having a capacitive structure or an inductive structure, may be connected to the clock grid of an adjacent second die, where the clock grids of such dies are synchronous with each other. In such an implementation, the LC tank circuit may be shared between the first and second dies, with the clock grids of such dies resonating at the same frequency and synchronicity being maintained. While this example regards two die layers, embodiments are not limited to any particular number of die layers, and the sharing of an LC tank circuit may be implemented in any group of connected die layers.

Figure 4:
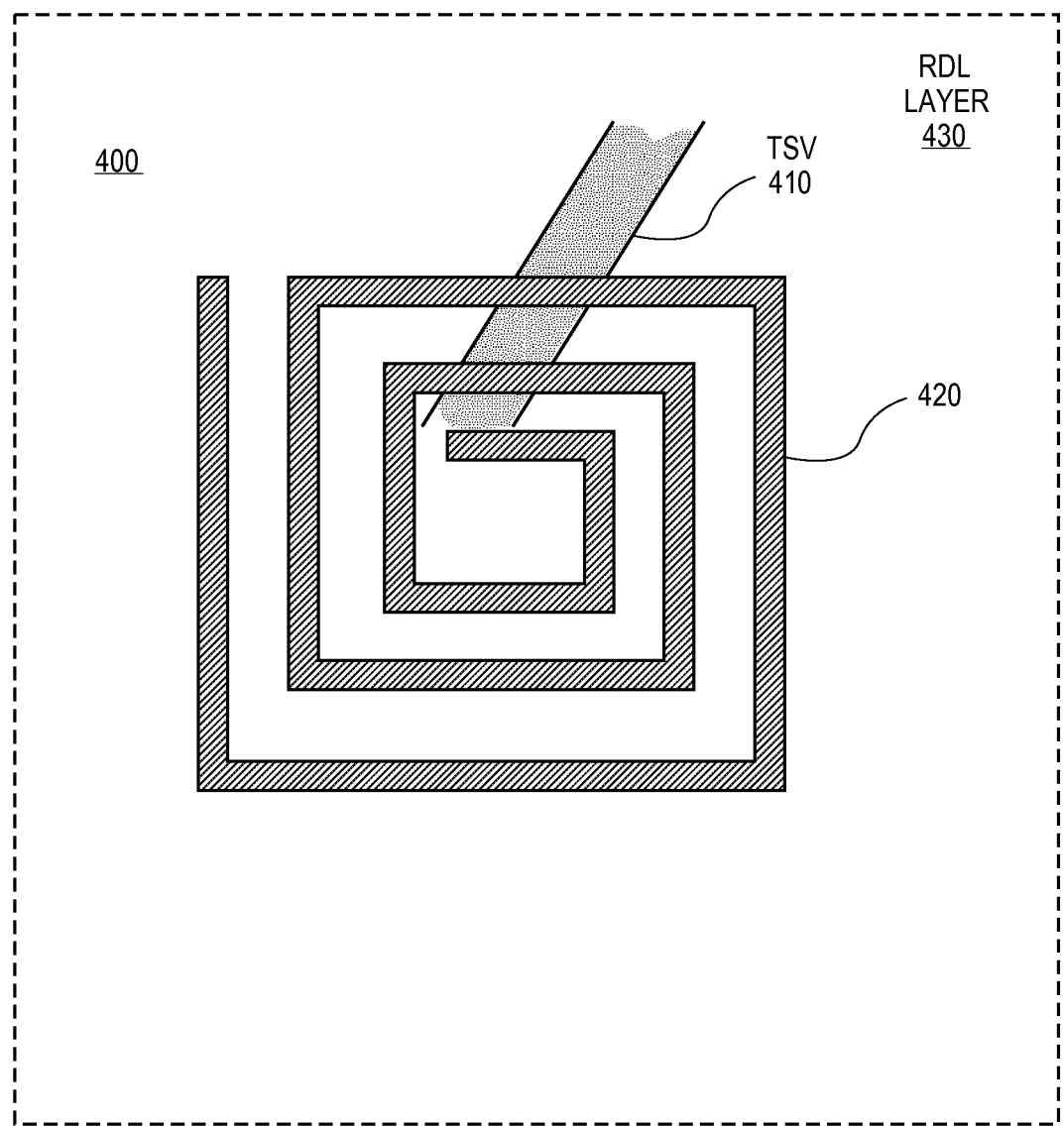
FIG. 4 is an illustration of inductive and capacitive circuit elements in an embodiment of an apparatus.

FIG. 4 is an illustration of inductive and capacitive circuit elements in an embodiment of an apparatus. In some embodiments, a stacked device, including, for example, the stacked device 300 illustrated in FIG. 3, includes a resonant circuit 400 for resonant clocking of the stacked device. In some embodiments, the resonant circuit includes TSV 410, where TSV 410 includes a capacitive structure, the TSV connecting an active side of a die of the stacked device with an RDL side of the die 430. In some embodiments, the resonant circuit 400 further includes an inductive circuit component. In some embodiments, the circuit component is an on-chip inductor, including, for example, a spiral inductor 420 on the RDL side of the die 430, the TSV being coupled with the inductor. In some embodiments, the capacitive structure of the TSV and the on-chip inductor together form an LC tank circuit for resonant clocking.

Figure 5:
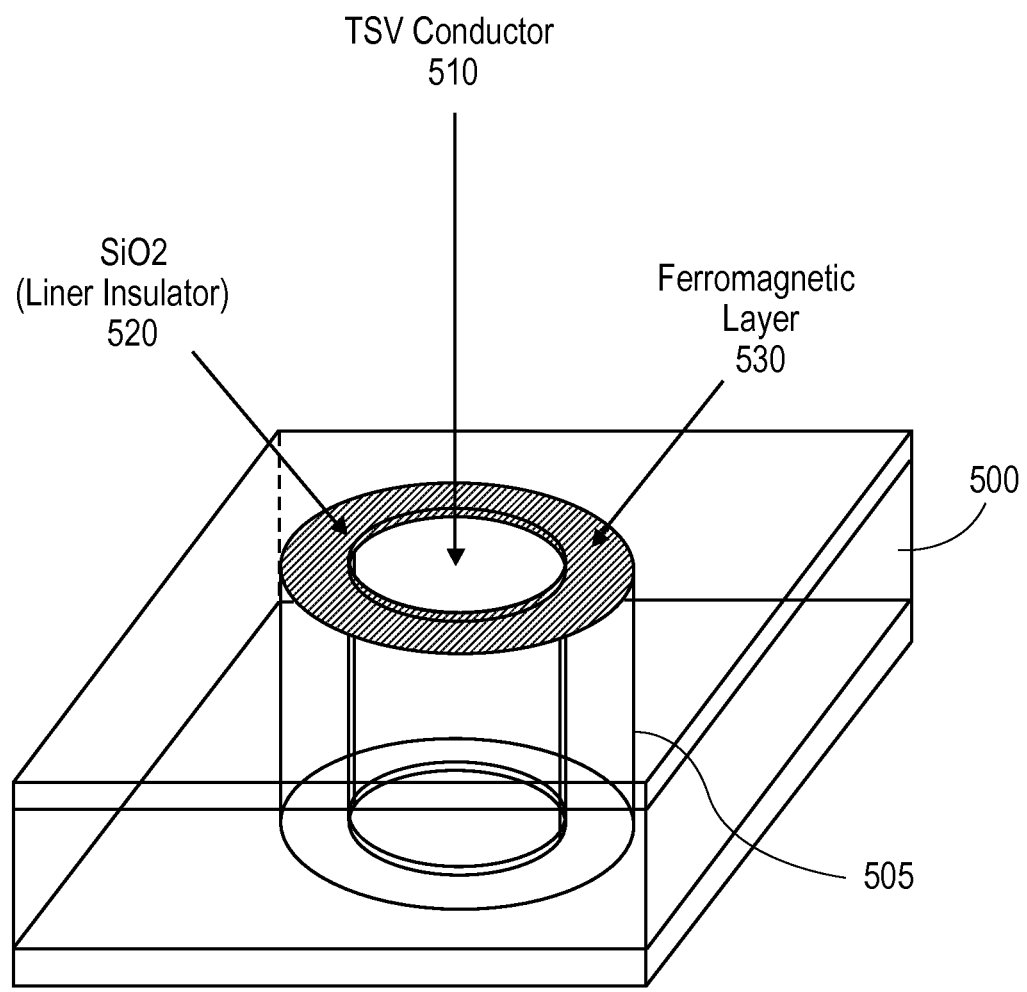
FIG. 5 is an illustration of an embodiment of an inductive structure for a through silicon via.

FIG. 5 is an illustration of an embodiment of an inductive structure for a through silicon via. In some embodiments, a TSV in a silicon die includes an inductive structure. In some embodiments, the TSV inductive structure may be coupled with capacitance of a silicon die to create a resonant circuit, which may be, for example, a resonant circuit for transmission of clocking through an apparatus.

In some embodiments, a TSV 505 is formed in a silicon die 500, where the silicon die is a die of a stacked device. In some embodiments, the TSV 505 includes a TSV conductor 510, where the TSV conductor may have a cylindrical, tapered cylinder, or other similar shape. The conductor may be any material used in the filling of TSVs, including copper or tungsten. In some embodiments, the conductor is surrounded by an insulator 520, such as the SiO2 (silicon dioxide) insulator surrounding the TSV conductor 510, the insulator having a hollow shape, such as hollow cylinder (tube), hollow tapered cylinder, or similar shape. In some embodiments, the cylindrical insulator 520 is surrounded by a ferromagnetic layer 530, the ferromagnetic layer again forming a hollow cylinder, hollow tapered cylinder, or similar shape around the insulator layer. In such a structure, an inductance is generated for signals transferred via the TSV 505. In some embodiments, the TSV 505 is coupled with a capacitance to create an LC tank circuit, such as a circuit for resonant clocking of a device.

However, embodiments are not limited to the particular illustrated inductive structure, and may include other structures by which a TSV may be utilized to generate inductance. In one example, an inductive structure may include a solenoid structure using a TSV, the RDL of the respective die on the back side, and an active metal layer such as a thick metal layer.

Figure 6:
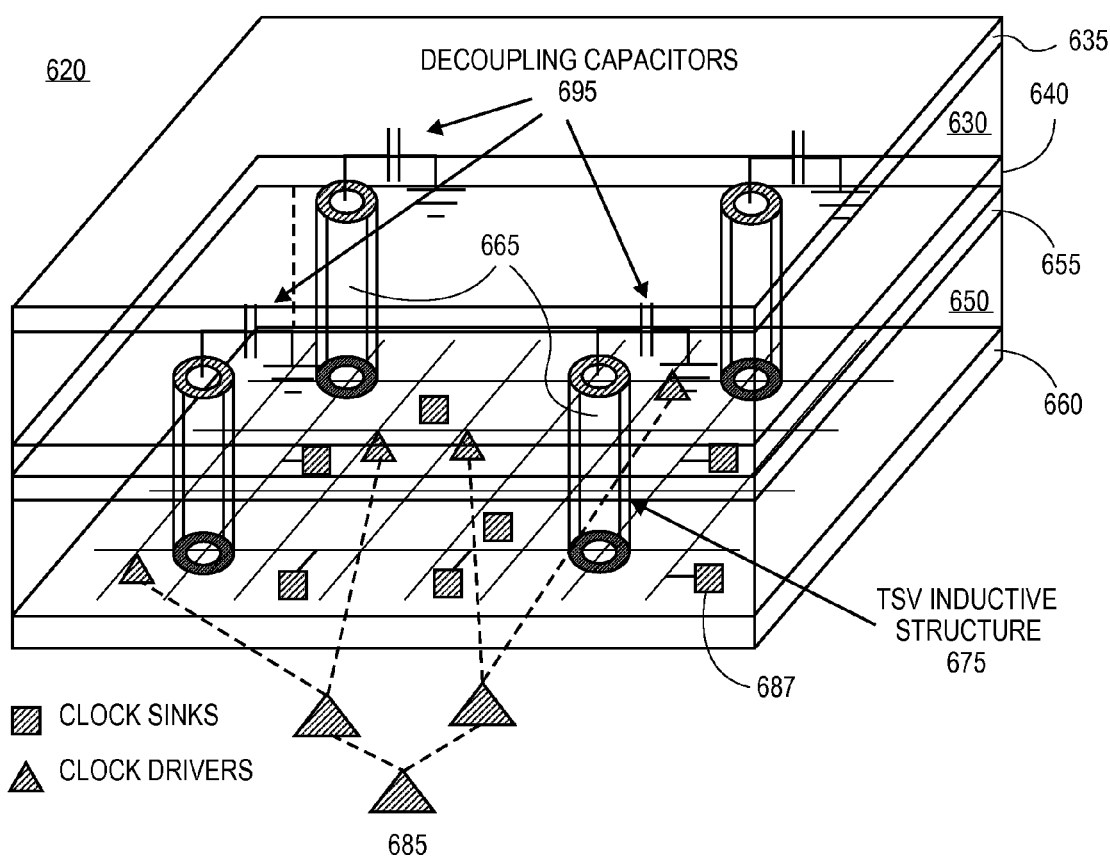
FIG. 6 is an illustration of a portion of an embodiment of a stacked device including a resonant clock network.

FIG. 6 is an illustration of a portion of an embodiment of a stacked device including a resonant clock network. In some embodiments, a stacked device includes an alternative structure from the illustration in FIG. 3. In some embodiments, the stacked device includes multiple TSVs connecting multiple die layers, where such TSVs generate inductance and are connected to capacitive circuit components to create resonant circuits.

In this illustration, a portion 620 of the stacked device may include two stacked die layers, a first (upper) layer 630 with an active metal side 640 and an opposite RDL 635 and a second (lower) layer 650 with an active metal side 660 and an opposite RDL 655. The first layer 630 may include a first set of TSVs (not shown to assist in visibility of the drawing) formed through the first layer, and the second layer 650 includes a second set of TSVs 665 formed through the second layer. Clock drivers 685 drive clock signals on the die layers, where the clock signals are carried by one or more TSVs through each die layer to the next die in the stacked device, with clock sinks 687 also illustrated in FIG. 6. Other TSVs may be utilized for other purposes, including the transport of other signals between die layers and conducting power to each die layer.

In some embodiments, the one or more TSVs include inductive structures 675 to generate inductance for resonant circuits. The inductive structures may be as illustrated in FIG. 5, including a conductor and a coaxial ferromagnetic layer separated by an insulator. The one or more TSVs are further connected to capacitances, such as the illustrated capacitors 695. In some embodiments, the TSVs 665 of the second layer 650 are coupled with capacitors 695 on the active layer 640 of the first layer, the capacitors and the inductive structures forming the resonant circuits. In some embodiments, the one or more TSVs are utilized both for the transport of clock signals between die layers and for the generation of inductance for the resonant circuits. In some embodiments, the resonant circuits may include additional inductive or capacitive elements to tune the resonant circuits to a clock frequency for resonant clocking operation.

In general, an embodiment of an apparatus may include a plurality of integrated circuit die layers; and a plurality of TSVs through at least one of the plurality of die layers, wherein one or more of the TSVs includes a capacitive structure or an inductive structure. In some embodiments, the apparatus includes a resonant circuit including: a first through silicon via of the one or more through silicon vias, the first through silicon via being formed in a first die, and a first circuit component coupled with the first through silicon via, the circuit component being an inductor if the first through silicon via has a capacitive structure and being a capacitor if the first through silicon via has an inductive structure. In some embodiments, the apparatus may further include one or more additional capacitive or inductive components to tune the circuit to a desired resonant frequency. In some embodiments, the resonant circuit includes both a first through silicon via having an capacitive structure and a second through silicon via having an inductive structure, where the first and second through silicon via may be coupled with one or more additional capacitive or inductive components to tune the circuit to a desired resonant frequency.

In a particular example of a TSV including a capacitive structure, a spiral inductor in the form of a 3 turn lateral inductor utilizing the RDL with a spacing of 2 μm (microns or micrometers), a turn width of 1 μm and outer diameter of 50 μm, results in an inductance of approximately 0.8 nH (nanohenries). If a clock frequency of 3.66 GHz (gigahertz) is assumed, Frequency (f)=3.66 GHz and Inductance (L)=0.8 nH results in Capacitance (C)=2 pF (picofarads). In this example, such capacitance may be achieved by utilizing parallel TSV coaxial structures, or utilizing a single TSV structure combined with on-die capacitors to form the capacitance.

In a particular example of a TSV including an inductive structure, an inductance of 1 nH produced by the TSV then requires a capacitance of 1.8 pF to provide a resonant frequency of 3.66 GHz.

Figure 7:
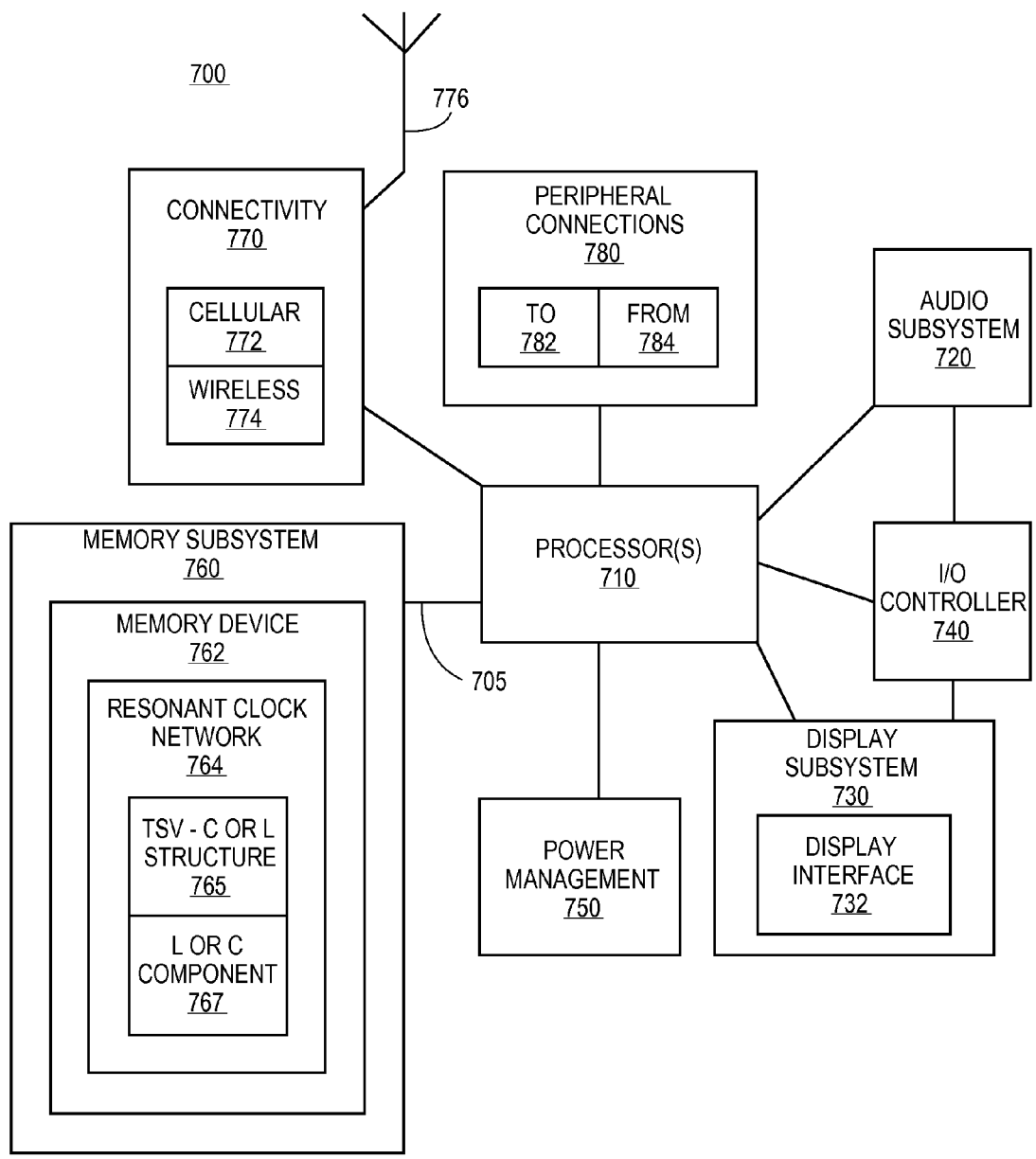
FIG. 7 is an illustration of an embodiment of an apparatus or system including a stacked device providing resonant clocking.

FIG. 7 is an illustration of an embodiment of an apparatus or system including a stacked device providing resonant clocking. Computing device 700 represents a computing device including a mobile computing device, such as a laptop computer, a tablet computer (including a device having a touchscreen without a separate keyboard; a device having both a touchscreen and keyboard; a device having quick initiation, referred to as "instant on" operation; and a device that is generally connected to a network in operation, referred to as "always connected", a mobile phone or smart phone, a wireless-enabled e-reader, or other wireless mobile device. It will be understood that certain of the components are shown generally, and not all components of such a device are shown in device 700. The components may be connected by one or more buses or other connections 705.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications, device functions, or both are executed. The processing operations include operations related to I/O (input/output) with a human user or with other devices, operations related to power management, operations, or both related to connecting device 700 to another device. The processing operations may also include operations related to audio I/O, display I/O, or both.

In one embodiment, device 700 includes audio subsystem 720, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 700, or connected to device 700. In one embodiment, a user interacts with device 700 by providing audio commands that are received and processed by processor 710.

Display subsystem 730 represents hardware (such as display devices) and software (such as drivers) components that provide a display having visual, tactile, or both elements for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touch screen device that provides both output and input to a user.

I/O controller 740 represents hardware devices and software components related to interaction with a user. I/O controller 740 can operate to manage hardware that is part of audio subsystem 720, a display subsystem 730, or both such subsystems. Additionally, I/O controller 740 illustrates a connection point for additional devices that connect to device 700 through which a user might interact with the system. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720, display subsystem 730, or both such subsystems. For example, input through a microphone or other audio device can provide input or commands for one or more applications or functions of device 700. Additionally, audio output can be provided instead of or in addition to display output. In another example, if display subsystem includes a touch screen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In one embodiment, device 700 includes power management 750 that manages battery power usage, charging of the battery, and features related to power saving operation.

In some embodiments, memory subsystem 760 includes memory devices for storing information in device 700. The processor 710 may read and write data to elements of the memory subsystem 760. Memory can include nonvolatile (having a state that does not change if power to the memory device is interrupted), volatile (having a state that is indeterminate if power to the memory device is interrupted) memory devices, or both such memories. Memory 760 can store application data, user data, music, photos, documents, or other data, as well as system data (whether long-term or temporary) related to the execution of the applications and functions of system 700.

In some embodiments, a subsystem may include a stacked device, wherein the stacked device includes a resonant clock network. In an example, the memory subsystem 760 may include a memory device 762, such as a stacked memory device, wherein the memory device includes a resonant clock network 764. In some embodiments, the resonant clock network 764 includes one or more TSVs including a capacitive structure, an inductive structure, or both 765, such as, for example, the capacitive structure 375 illustrated in FIG. 3 or the inductive structure 675 in FIG. 6. In some embodiments, each of the one or more TSVs 765 is coupled with a respective inductive or capacitive component 767 to form an LC tank circuit for the resonant clock network, such as the RDL based inductor 380 coupled with a TSV with an capacitive structure 375 illustrated in FIG. 3 or the capacitor 695 coupled with a TSV with inductive structure 675 illustrated in FIG. 6. However, embodiments are not limited to stacked memory device, and in some embodiments a different subsystem may include one or more other stacked devices including resonant clock networks.

Connectivity 770 includes hardware devices (e.g., connectors and communication hardware for wireless communication, wired communication, or both) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 776.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 commonly has a "docking" connector to connect to other computing devices for purposes such as managing (such as downloading, uploading, changing, or synchronizing) content on device 700. Additionally, a docking connector can allow device 700 to connect to certain peripherals that allow device 700 to control content output, for example, to audiovisual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 8:
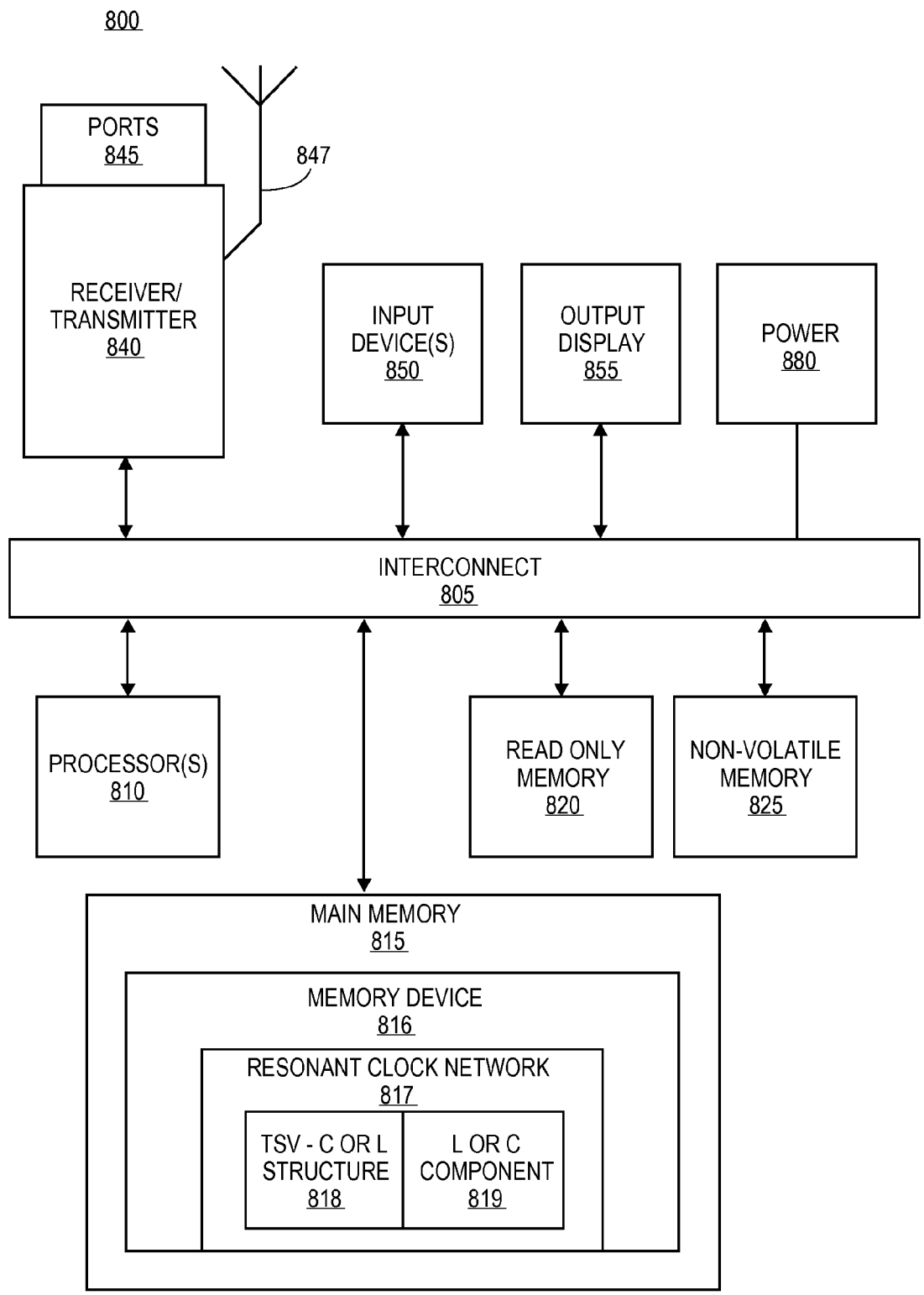
FIG. 8 illustrates an embodiment of a computing system including a stacked device utilizing resonant clocking.

FIG. 8 illustrates an embodiment of a computing system including a stacked device utilizing resonant clocking. The computing system may include a computer, server, game console, or other computing apparatus. In this illustration, certain standard and well-known components that are not germane to the present description are not shown. Under some embodiments, the computing system 800 comprises an interconnect or crossbar 805 or other communication means for transmission of data. The computing system 800 may include a processing means such as one or more processors 810 coupled with the interconnect 805 for processing information. The processors 810 may comprise one or more physical processors and one or more logical processors. The interconnect 805 is illustrated as a single interconnect for simplicity, but may represent multiple different interconnects or buses and the component connections to such interconnects may vary. The interconnect 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 815 for storing information and instructions to be executed by the processors 810. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the computing system includes one or more stacked devices, the one or more stacked devices including resonant clocking networks. In an example, the main memory 815 includes a memory device 816, such as a stacked memory device, wherein the memory device includes a resonant clock network 817. In some embodiments, the resonant clock network 817 includes one or more TSVs including a capacitive structure, an inductive structure, or both 818, such as, for example, the capacitive structure 375 illustrated in FIG. 3 or the inductive structure 675 in FIG. 6. In some embodiments, each of the one or more TSVs 818 is coupled with a respective inductive or capacitive component 819 to form an LC tank circuit for the resonant clock network, such as the RDL based inductor 380 coupled with a TSV with an capacitive structure 375 illustrated in FIG. 3 or the capacitor 695 coupled with a TSV with inductive structure 675 illustrated in FIG. 6. In some embodiments, the resonant clock network may include a first through silicon via with a capacitive structure and a second through silicon via with an inductive structure.

The computing system 800 also may comprise a read only memory (ROM) 820 or other static storage device for storing static information and instructions for the processors 810. The computing system 800 may include one or more nonvolatile memory elements 825 for the storage of certain elements.

One or more transmitters or receivers 840 may also be coupled to the interconnect 805. In some embodiments, the computing system 800 may include one or more ports 845 for the reception or transmission of data. The computing system 800 may further include one or more omnidirectional or directional antennas 847 for the reception of data via radio signals.

In some embodiments, the computing system 800 includes one or more input devices 850, where the input devices include one or more of a keyboard, mouse, touch pad, voice command recognition, gesture recognition, sensors or monitors (including sensors or monitors providing power and performance data), or other device for providing an input to a computing system.

The computing system 800 may also be coupled via the interconnect 805 to an output display 855. In some embodiments, the display 855 may include a liquid crystal display (LCD) or any other display technology, for displaying information or content to a user. In some environments, the display 855 may include a touch-screen that is also utilized as at least a part of an input device. In some environments, the display 855 may be or may include an audio device, such as a speaker for providing audio information.

The computing system 800 may also comprise a power device or system 860, which may comprise a power supply, a battery, a solar cell, a fuel cell, or other system or device for providing or generating power. The power provided by the power device or system 880 may be distributed as required to elements of the computing system 800.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

In some embodiments, an apparatus includes a stack including a plurality of integrated circuit dies; and a plurality of through silicon vias through at least one of the plurality of dies, wherein one or more of the through silicon vias includes a capacitive structure or an inductive structure. The apparatus includes a resonant circuit including: a first through silicon via of the one or more through silicon vias, the first through silicon via being formed in a first die of the plurality of dies.

In some embodiments, the apparatus further a first circuit element coupled with the first through silicon via, the first circuit element being an inductor if the first through silicon via has a capacitive structure and a capacitor if the first through silicon via has an inductive structure. In some embodiments, the first circuit element is an inductor on a back side of the first die including a redistribution layer. In some embodiments, the first circuit element is a capacitor, wherein the capacitor is on an active metal layer of a second die of the plurality of dies.

In some embodiments, wherein the first circuit element is a second through silicon via, the second through silicon via having an inductive structure if the first through silicon via has a capacitive structure and having a capacitive structure if the first silicon through silicon via has an inductive structure.

In some embodiments, the resonant circuit includes one or more additional capacitive or inductive circuit elements.

In some embodiments, the resonant circuit is shared with a second die of the plurality of dies, the second die being adjacent to the first die, a clock grid of the first die being synchronous with a clock grid of the second die.

In some embodiments, the apparatus includes one or more clock drivers to drive a clock signal, the clock signal being driven on the first through silicon via. In some embodiments, the resonant circuit is tuned to a frequency of the clock signal.

In some embodiments, the first through silicon via includes a capacitive structure, the capacitive structure including a first conductor; a dielectric layer formed around the first conductor; and a second conductor formed around the dielectric layer. In some embodiments, the first conductor and the second conductor are coaxial conductors. In some embodiments, the first conductor has a cylindrical shape and the second conductor has a hollow cylindrical shape.

In some embodiments, the first through silicon via includes an inductive structure, the inductive structure including: a conductor; an insulating layer formed around the conductor; and a ferromagnetic layer formed around the insulating layer. In some embodiments, the conductor has a cylindrical shape and the ferromagnetic layer has a hollow cylindrical shape.

In some embodiments, a memory device includes a plurality of die layers including a memory stack of one or more memory die layers and a system die layer coupled with the memory stack, at least one of the die layers including a plurality of through silicon vias; and a resonant clock network including a first through silicon via of the one or more through silicon vias, the first through silicon via including a capacitive structure or an inductive structure, the first through silicon via providing a capacitance or inductance for the resonant clock network.

In some embodiments, the resonant clock network further includes a circuit element coupled with the first through silicon via, the circuit element being an inductor if the first through silicon via has a capacitive structure and a capacitor if the first through silicon via has an inductive structure.

In some embodiments, the resonant circuit includes one or more additional capacitive or inductive circuit elements.

In some embodiments, the resonant circuit is shared with a second die layer of the plurality of die layers, the second die layer being adjacent to the first die layer, a clock grid of the first die layer being synchronous with a clock grid of the second die layer.

In some embodiments, the resonant clock network is tuned to a clock frequency for the memory device.

In some embodiments, a system includes a processor to process data; transmitter or receiver for transmission of data; and a memory to store data, the memory providing for resonant clocking, the memory including: a clock driver to provide a clock signal, a through silicon via formed in a first memory die, the through silicon operable to carry the clock signal, the through silicon via to operate as either an capacitance or inductance in an LC tank circuit that is resonant with a clock frequency.

In some embodiments, the through silicon via is to operate as a capacitance, the through silicon via being coupled with an inductor to form the LC tank circuit. In some embodiments, the through silicon via is to operate as an inductance, the through silicon via being coupled with a capacitor to form the LC tank circuit. In some embodiments, the through silicon via is to operate as both a capacitor and an inductor to form the LC tank circuit. In some embodiments, the LC tank circuit includes one or more capacitive or inductive elements to tune the resonant clocking to the clock frequency.

In some embodiments, a computer chip includes: a silicon die; and one or more through silicon vias through the silicon die. The one or more silicon vias include a first silicon via, the first silicon via having a capacitive structure to provide a capacitance, an inductive structure to provide an inductance, or both for a resonant circuit.

In some embodiments, the computer chip is coupled with one or more additional computer chips in a stacked device. In some embodiments, the resonant circuit is shared with a second computer chip of the one or more additional computer chips. In some embodiments, the resonant circuit is resonant with a frequency of a clock signal that is driven on the computer chip.

What is claimed is:
1. An apparatus comprising:
   a stack including a plurality of integrated circuit die layers including at least a first die layer and an adjacent second die layer, each die layer including an active metal side and an opposite RDL (re-distribution layer); and a plurality of through silicon vias including a first set of through silicon vias formed through the first die layer and a second set of through silicon vias formed through the second die layer, wherein each of the first set of through silicon vias includes an inductive structure and each of the second set of through silicon vias includes a capacitive structure;

wherein the apparatus includes a plurality of resonant circuits to carry clock signals, each of the resonant circuits including a first through silicon via of the first set of through silicon vias used as an inductive circuit element of the resonant circuit and a second through silicon via of the second set of through silicon vias used as a capacitive circuit element of the resonant circuit, the first through silicon via of each resonant circuit being coupled with the respective second through silicon via of the resonant circuit via the RDL of the first die layer;

wherein each of the first set of through silicon vias is utilized both for transport of the clock signals between die layers, including transport of clock signals from the first die layer to the second die layer, and for the generation of inductance for the respective resonant circuit; and wherein each of the resonant circuits is shared between the first die layer and the second die layer, a clock grid of the first die layer resonating at a same frequency and being synchronous with a clock grid of the second die layer.

2. The apparatus of claim 1, wherein each resonant circuit includes one or more additional capacitive or inductive circuit elements to tune the frequency of the resonant circuit.

3. The apparatus of claim 1, further comprising one or more clock drivers to drive a clock signal, the clock signal being driven on the first through silicon via, wherein the resonant circuit is tuned to a frequency of the clock signal.

4. The apparatus of claim 1, wherein the capacitive structure of the second through silicon via of each resonant circuit including:
   a first conductor;
   a dielectric layer formed around the first conductor; and
   a second conductor formed around the dielectric layer.

5. The apparatus of claim 4, wherein the first conductor and the second conductor are coaxial conductors.

6. The apparatus of claim 4, wherein the first conductor has a cylindrical shape and the second conductor has a hollow cylindrical shape.

7. The apparatus of claim 1, wherein the inductive structure of the first through silicon via of each resonant circuit including:
   a conductor;
   an insulating layer formed around the conductor; and
   a ferromagnetic layer formed around the insulating layer.

8. The apparatus of claim 7, wherein the conductor has a cylindrical shape and the ferromagnetic layer has a hollow cylindrical shape.

9. A memory device including:
   a plurality of die layers including a memory stack of a plurality of memory die layers including at least a first die layer and an adjacent second die layer, each die layer, including an active metal side and an opposite RDL (re-distribution layer), and a system die layer coupled with the memory stack, a plurality of through silicon vias including a first set of through silicon vias formed through the first die layer and a second set of through silicon vias formed through the second die layer; and a resonant clock network including a plurality of resonant circuits to carry clock signals, each of the resonant circuits including:
      a first through silicon via of the first set of through silicon vias, each first through silicon via including an inductive structure, the first through silicon via being used as an inductive circuit element to provide inductance for the resonant circuit, and
      a second through silicon via of the second set of through silicon vias, each second through silicon via including a capacitive structure, the second through silicon via being used as a capacitive circuit element of the resonant circuit, the first through silicon via of each resonant circuit being coupled with the respective second through silicon via of the resonant circuit via the RDL of the first die layer;
   wherein each of the first set of through silicon vias is utilized both for transport of the clock signals between die layers, including transport of clock signals from the first die layer to the second die layer, and for the generation of inductance for the respective resonant circuit; and
   wherein each of the resonant circuits is shared between the first die layer and the second die layer, a clock grid of the first die layer resonating at a same frequency and being synchronous with a clock grid of the second die layer.

10. The memory device of claim 9, wherein the resonant clock network includes one or more additional capacitive or inductive elements to tune a frequency of the resonant clock network.

11. The memory device of claim 10, wherein the resonant clock network is tuned to a clock frequency for the memory device.

12. A system comprising:
   a processor to process data;
   a transmitter or receiver for transmission of data; and
   a memory to store data, the memory providing for resonant clocking, the memory including:
      a clock driver to provide a clock signal,
      a plurality of die layers including a memory stack of a plurality of memory die layers including at least a first die layer and an adjacent second die layer, each die layer, including an active metal side and an opposite RDL (re-distribution layer), and a system die layer coupled with the memory stack, a plurality of through silicon vias including a first set of through silicon vias formed through the first die layer and a second set of through silicon vias formed through the second die layer, and
      a resonant clock network including a plurality of LC tank circuits to carry clock signals, each of the LC tank circuits including:
         a first through silicon via of the first set of through silicon vias, each first through silicon via including an inductive structure, the first through silicon via being using as an inductive circuit element to provide inductance for the LC tank circuit, and
         a second through silicon via of the second set of through silicon vias, each second through silicon via including a capacitive structure, the second through silicon via being used as a capacitive circuit element of the LC tank circuit, the first through silicon via of each LC tank circuit being coupled with the respective second through silicon via of the LC tank circuit via the RDL of the first die layer;
      wherein each of the first set of through silicon vias is utilized both for transport of the clock signals between die layers, including transport of clock signals from the first die layer to the second die layer, and for the generation of inductance for the respective LC tank circuit; and wherein each of the LC tank circuits is shared between the first die layer and the second die layer, a clock grid of the first die layer resonating at a same frequency and being synchronous with a clock grid of the second die layer.

13. The system of claim 12, wherein the LC tank circuit includes one or more additional capacitive or inductive elements to tune the resonant clocking to the clock frequency.

14. A computer chip comprising:

a first silicon die and a second silicon die, each silicon die including an active metal side and an opposite RDL (re-distribution layer); and a plurality of through silicon vias including a first set of through silicon vias formed through the first silicon die and a second set of through silicon vias formed through the second silicon die, wherein each of the first set of through silicon vias includes an inductive structure and each of the second set of through silicon vias includes a capacitive structure;

wherein the computer chip includes a plurality of resonant circuits to carry clock signals, each of the resonant circuits including a first through silicon via of the first set of through silicon vias used as an inductive circuit element of the resonant circuit and a second through silicon via of the second set of through silicon vias used as a capacitive circuit element of the resonant circuit, the first through silicon via of each resonant circuit being coupled with the respective second through silicon via of the resonant circuit via the RDL of the first silicon die;

wherein each of the first set of through silicon vias is utilized both for transport of the clock signals between silicon dies, including transport of clock signals from the first silicon die to the second silicon die, and for the generation of inductance for the respective resonant circuit;

wherein the resonant circuit is resonant with a frequency of a clock signal that is driven on the computer chip; and wherein each of the resonant circuits is shared between the first die layer and the second die layer, a clock grid of the first die layer resonating at a same frequency and being synchronous with a clock grid of the second die layer.

* * * * *